United States Patent
Cheng et al.

(10) Patent No.: US 8,227,334 B2
(45) Date of Patent: Jul. 24, 2012

(54) DOPING MINOR ELEMENTS INTO METAL BUMPS

(75) Inventors: Ming-Da Cheng, Jhubei (TW); Ming-Che Ho, Tainan (TW); Chung-Shi Liu, Shin-Chu (TW); Chien Ling Hwang, Hsin-Chu (TW); Cheng-Chung Lin, Taipei (TW); Hui-Jung Tsai, Hsin-Chu (TW); Zheng-Yi Lim, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/843,760

(22) Filed: Jul. 26, 2010

(65) Prior Publication Data
US 2012/0018878 A1    Jan. 26, 2012

(51) Int. Cl.
  *H01L 21/00* (2006.01)
(52) U.S. Cl. .......... 438/614; 438/612
(58) Field of Classification Search .......... 438/612–617
  See application file for complete search history.

(56) References Cited

U.S. PATENT DOCUMENTS

| | | | | | |
|---|---|---|---|---|---|
| 3,872,236 | A | * | 3/1975 | Swengel et al. | 174/251 |
| 5,356,838 | A | * | 10/1994 | Kim | 438/465 |
| 5,587,337 | A | * | 12/1996 | Idaka et al. | 438/613 |
| 5,858,815 | A | * | 1/1999 | Heo et al. | 438/112 |
| 6,841,478 | B2 | * | 1/2005 | McTeer | 438/687 |
| 7,700,476 | B2 | * | 4/2010 | Suh et al. | 438/615 |
| 2003/0162381 | A1 | | 8/2003 | Tong et al. | |
| 2004/0065949 | A1 | * | 4/2004 | Chen et al. | 257/692 |
| 2006/0279000 | A1 | | 12/2006 | Chang et al. | |
| 2010/0155115 | A1 | * | 6/2010 | Pang et al. | 174/257 |

FOREIGN PATENT DOCUMENTS

KR    1020040087210    10/2004

OTHER PUBLICATIONS

Korhonen et al., Interconnections basd on Bi-coated SnAg Solder Balls:, IEEE Transactions on Advanced Packaging, vol. 24, No. 4, Nov. 2001, pp. 515-520.*

* cited by examiner

*Primary Examiner* — Richard A. Booth
(74) *Attorney, Agent, or Firm* — Slater & Matsil, L.L.P.

(57) ABSTRACT

A method of forming a device includes providing a substrate, and forming a solder bump over the substrate. A minor element is introduced to a region adjacent a top surface of the solder bump. A re-flow process is then performed to the solder bump to drive the minor element into the solder bump.

18 Claims, 8 Drawing Sheets

DOPING MINOR ELEMENTS INTO METAL BUMPS

TECHNICAL FIELD

This disclosure relates generally to integrated circuits, and more particularly to the methods of forming metal bumps.

BACKGROUND

In the formation of a semiconductor chip, integrated circuit devices such as transistors are first formed at the surface of a semiconductor substrate in the chip. Interconnect structures are then formed over the integrated circuit devices. Metal bumps are formed on the surface of the semiconductor chip, so that the integrated circuit devices can be accessed.

The properties of the metal bumps may be improved if minor elements such as germanium, silver, and/or copper are added. For example, conventional solder bumps suffer from under cooling effect, which means that the transition temperature from solid phase to liquid phase when the temperature of the solder bumps is increased is different from the transition temperature from liquid phase to solid phase when the temperature of the solder bumps is decreased. This results in a random solidification of the solder bumps, and hence the degradation in the quality of the solder bumps.

SUMMARY

In accordance with one aspect, a method of forming a device includes providing a substrate, and forming a solder bump over the substrate. After the step of forming the solder bump, a minor element is introduced to a region adjacent a top surface of the solder bump. A re-flow process is then performed to the solder bump to drive the minor element into the solder bump.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 7A through 9 illustrate cross-sectional views of intermediate stages in the formation of a metal bump in accordance with various embodiments, wherein the introduction of minor elements comprises an implantation or a deposition.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming metal bumps comprising desirable minor elements is provided in accordance with an embodiment. The intermediate stages of manufacturing the embodiment are illustrated. The variations of the embodiment are discussed. Throughout the various views and illustrative embodiments, like reference numbers are used to designate like elements.

Figure 1:
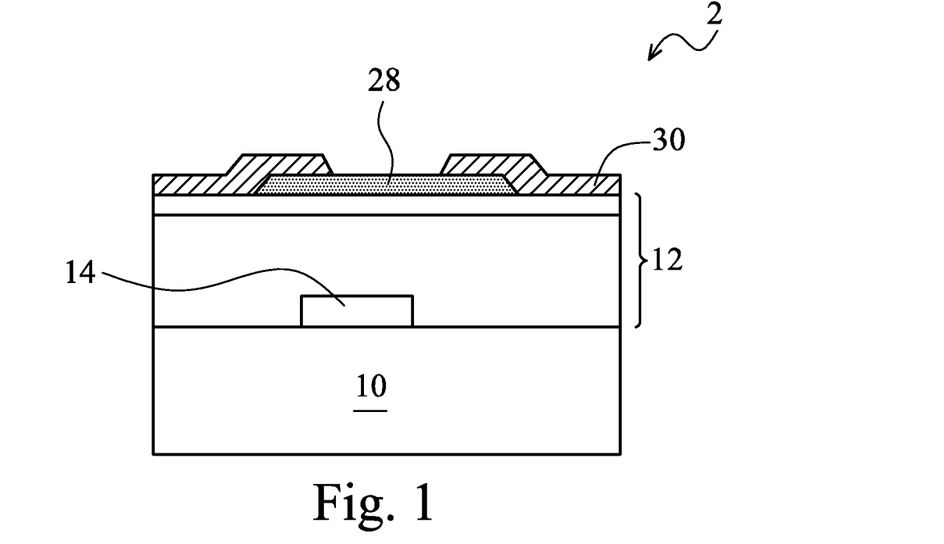
FIGS. 1 through 6 are cross-sectional views of intermediate stages in the manufacturing of a metal bump comprising minor elements in accordance with an embodiment, wherein the minor elements are added into a flux.

Referring to FIG. 1, wafer 2, which includes substrate 10, is provided. Substrate 10 may be a semiconductor substrate, such as a silicon substrate, although it may include other semiconductor materials, such as silicon germanium, silicon carbide, gallium arsenide, or the like. Semiconductor devices 14, such as transistors, may be formed at the surface of substrate 10. Interconnect structure 12, which includes metal lines and vias (not shown) formed therein and electrically coupled to semiconductor devices 14, is formed over substrate 10. The metal lines and vias may be formed of copper or copper alloys, and may be formed using the well-known damascene processes. Interconnect structure 12 may include an inter-layer dielectric (ILD) and inter-metal dielectrics (IMDs). In alternative embodiments, wafer 2 is an interposer wafer or a package substrate, and is substantially free from integrated circuit devices including transistors, resistors, capacitors, inductors, and/or the like, formed therein. In these embodiments, substrate 10 may be formed of a semiconductor material or a dielectric material such as silicon oxide.

Metal pad 28 is formed over interconnect structure 12. Metal pad 28 may comprise aluminum, copper (Cu), silver (Ag), gold (Au), nickel (Ni), tungsten (W), alloys thereof, and/or multi-layers thereof. Metal pad 28 may be electrically coupled to semiconductor devices 14, for example, through the underlying interconnection structure 12. Passivation layer 30 may be formed to cover edge portions of metal pad 28. In an exemplary embodiment, passivation layer 30 is formed of polyimide or other known dielectric materials such as silicon oxide, silicon nitride, and multi-layers thereof.

Figure 2:
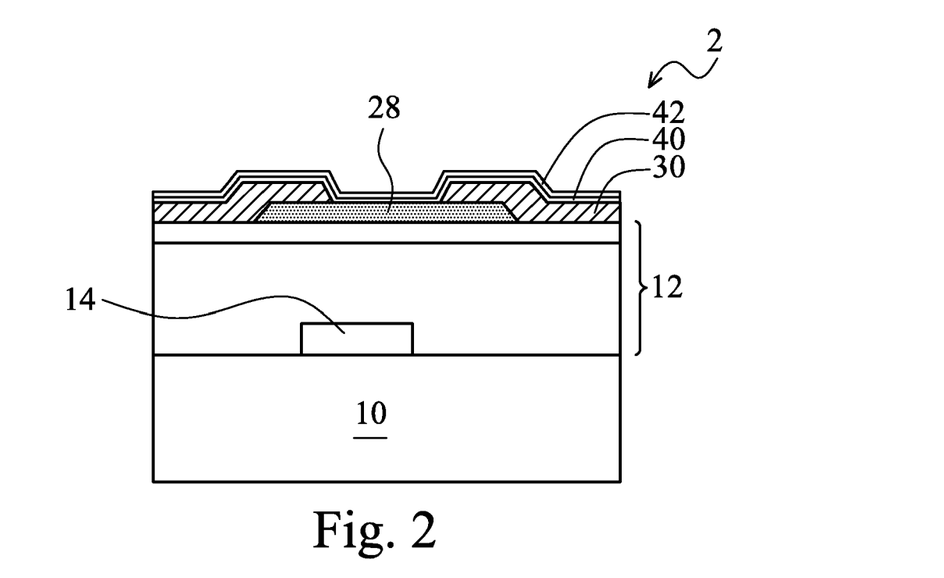

Referring to FIG. 2, an under-bump metallurgy (UBM), which may include an optional diffusion barrier layer 40 and seed layer 42, is blanket formed. Diffusion barrier layer 40 may be a titanium layer, a titanium nitride layer, a tantalum layer, or a tantalum nitride layer. The materials of seed layer 42 may include copper or copper alloys, and hence is alternatively referred to as copper seed layer 42 hereinafter. However, other metals, such as silver, gold, aluminum, and combinations thereof, may also be included. In an embodiment, diffusion barrier layer 40 and copper seed layer 42 are formed using physical vapor deposition or other applicable methods.

Figure 3:
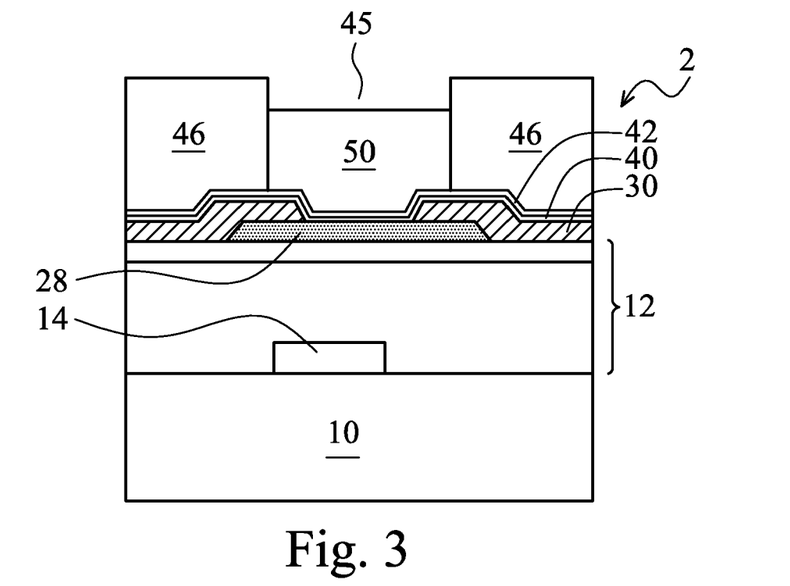

FIG. 3 illustrates the formation of mask 46, which may be formed of a photo resist, for example. Accordingly, a portion of copper seed layer 42 is exposed through opening 45 in mask 46. Next, wafer 2 is placed into a plating solution (not shown), and a plating is performed to form metal bump 50 on UBM 40/42 and in opening 45. The plating may be an electroplating, an electroless-plating, an immersion plating, or the like. In an embodiment, metal bump 50 is a solder bump, which may be formed of Sn—Ag, Sn—Ag—Cu, or the like, and may be lead-free or lead-containing.

Figure 4:
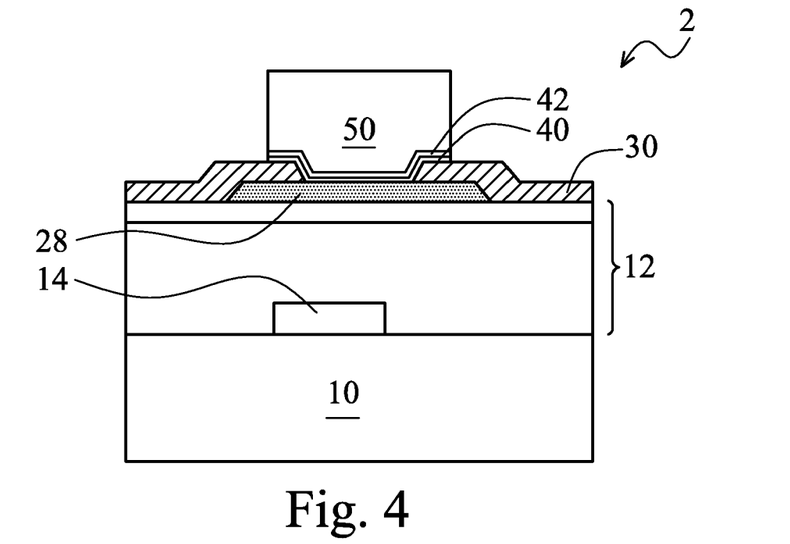

In the embodiment wherein metal bump 50 is a copper bump, additional layers (not shown) such as a nickel, a tin layer, a palladium, a gold layer, alloys thereof, and multi-layers thereof, may be formed on the surface of metal bump 50. Further, the additional layers may be formed before or after the subsequent removal of mask 46, which removal step is shown in FIG. 4. After the formation of metal bump 50, mask 46 is removed, and the portion of UBM 40/42 previously covered by mask 46 is also removed, for example, by an etch. The resulting structure is shown in FIG. 4.

Figure 5:
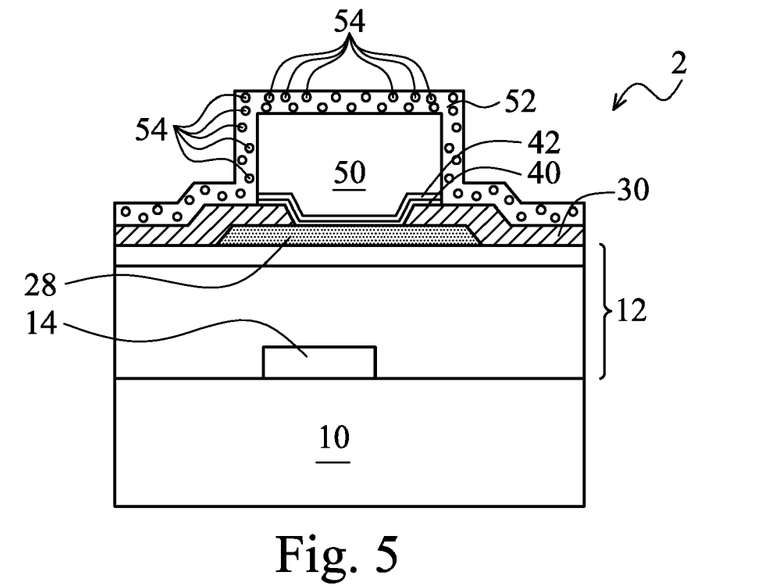

FIG. 5 illustrates the coating of flux 52 onto metal bump 50, wherein flux 52 may be coated using spin coating or dipping. Desirable minor elements, which are symbolized as 54, may be added into flux 52. Throughout the description, the term "minor elements" refers to the elements that have a low weight percentage in the resulting metal bump (for example, solder ball 56 in FIGS. 6 and 9), wherein the weight percentage of the minor elements may be less than about 0.2 percent, for example. The exemplary minor elements 54 may be selected from nickel, iron, manganese, titanium, cerium, antimony, and combinations thereof, although other minor elements may be added. In an exemplary embodiment wherein metal bump 50 is formed of Sn—Ag solder, the minor elements, in addition to the above-listed minor elements, may further be selected from bismuth and/or indium, and the like. In an alternative embodiment wherein metal bump 50 is formed of Sn—Ag—Cu solder, the minor elements, in addition to the above-listed minor elements, may further comprise germanium, zinc, and/or cobalt. The minor elements, depending on the material of metal bump 50, may have the functions such as preventing oxidation, improving wettability, enhancing mechanical behavior, improving creep resistance, improving electro-migration resistance, and/or the like.

Minor elements 54 may be pre-mixed in flux 52 before coating, wherein minor elements 54 may be in the form of powder (comprising atoms, for example). In alternative embodiments, minor elements 54 may be mixed in flux 52 in the form of a compound(s), and may exist in the form of ions. In an exemplary embodiment, the weight percentage of minor elements in flux 52 is greater than about 0.001 percent, or greater than about 0.005 percent, or between about 0.001 percent and about 0.2 percent.

Figure 6:
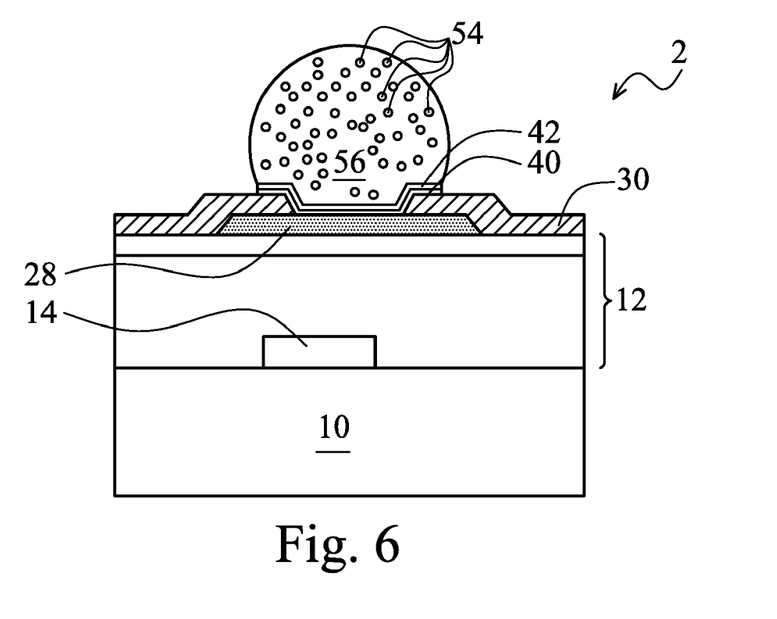
Figure 9:
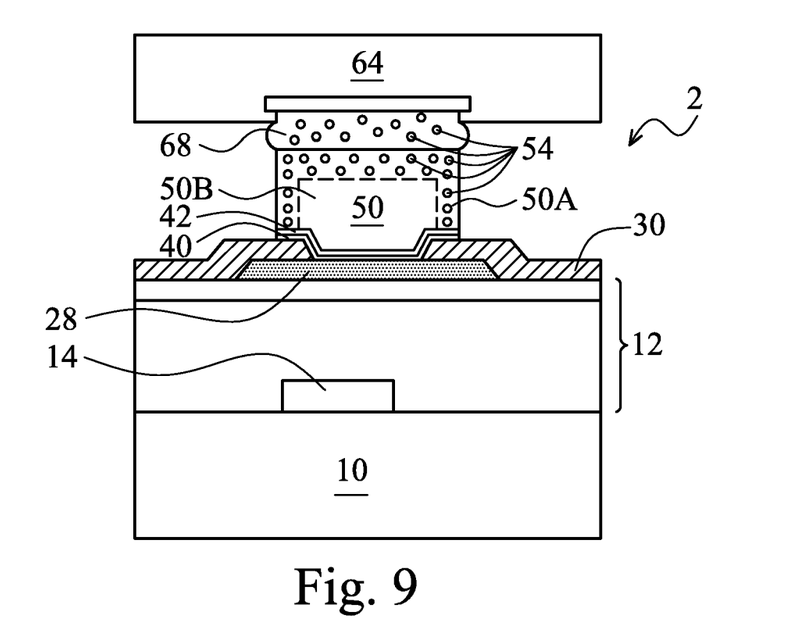

Next, as shown in FIG. 6, a re-flow is performed to metal bump 50, and hence metal bump 50 becomes solder ball 56 (which is also a solder bump). With metal bump 50 being melted, minor elements 54 in flux 52 can easily diffuse throughout solder ball 56. After the re-flow step, the residue of flux 52 may be removed. In the resulting solder ball/bump 56, the weight percentage of minor elements 54 may be between about 0.001 percent and about 0.2 percent, or between about 0.01 percent and about 0.1 percent, although different percentages may also be usable. After the formation of solder ball 56, and after the dicing of wafer 2, solder ball 56 and the respective die may be bonded to another integrated circuit component, such as package substrate 64 (or a printed circuit board (PCB)), as schematically illustrated in FIG. 9.

Figure 7A:
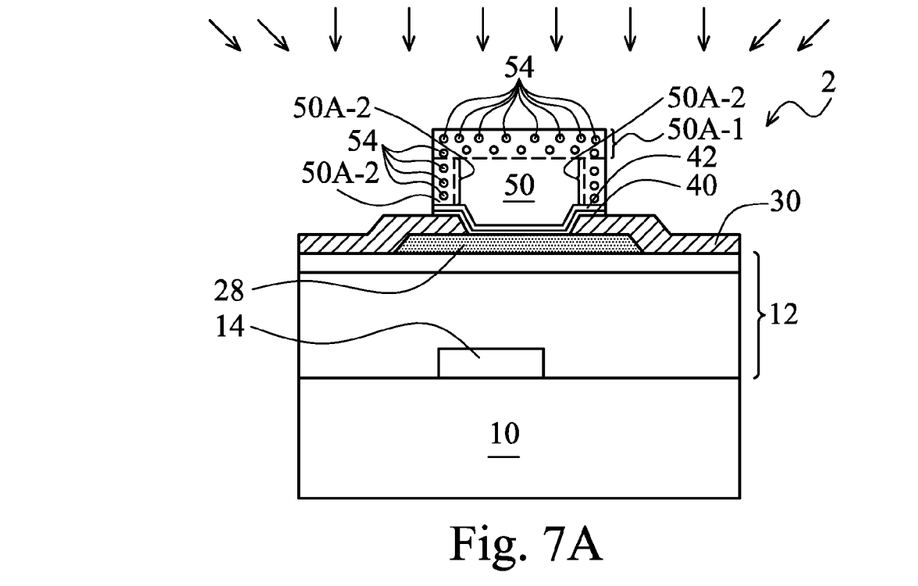

FIGS. 7A through 9 illustrate the cross-sectional views in accordance with various alternative embodiments. Unless specified otherwise, the reference numerals in these embodiments represent like elements in the embodiments illustrated in FIGS. 1 through 6. The initial steps of this embodiment may be essentially the same as shown in FIGS. 1 through 5. Next, as shown in FIG. 7A, an implantation is performed to introduce minor elements 54 into metal bump 50. Again, the minor elements may include germanium, bismuth, zinc, nickel, silver, cobalt, indium, and combinations thereof. If more than one type of the minor elements is needed, more than one implantation steps may be performed, with each introducing one type of the minor elements. The implantation may include a vertical implantation, and optionally tilted implantations. In alternative embodiments, the implantation may be performed after the formation of metal bump 50, and before the removal of mask 46. As a result of the implantation, minor elements 54 may be injected to a surface layer of metal bump 50, which surface layer may include a top surface layer 50A-1 and possibly sidewall surface layers 50A-2, as illustrated in FIG. 7A.

Figure 7B:
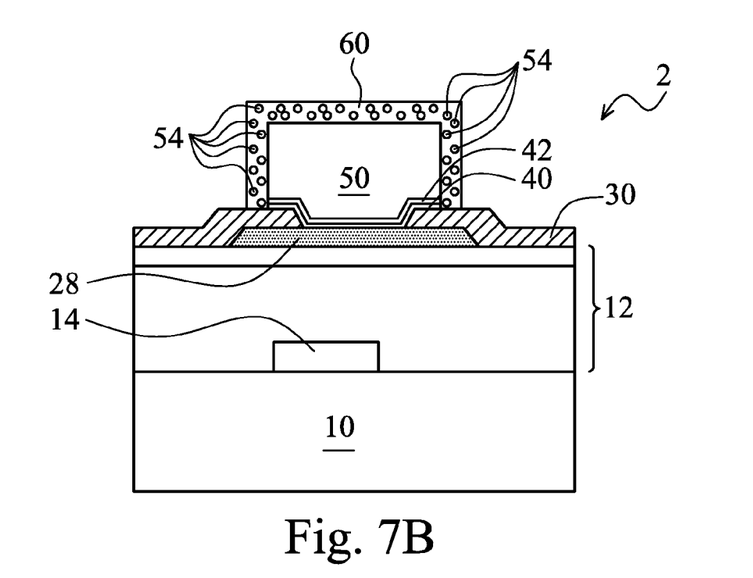

In alternative embodiments, instead of using implantation, a deposition step is performed to coat the minor element on the surface of metal bump 50. Referring to FIG. 7B, minor element containing layer 60 is formed using a deposition method selected from the methods including, but are not limited to, plasma ion assisted deposition (PIAD) and chemical vapor deposition (CVD) methods such as plasma enhanced CVD (PECVD), or other applicable methods. Minor element containing layer 60 may include substantially pure minor elements, or may be a compound layer comprising elements other than the desirable minor elements.

Figure 8:
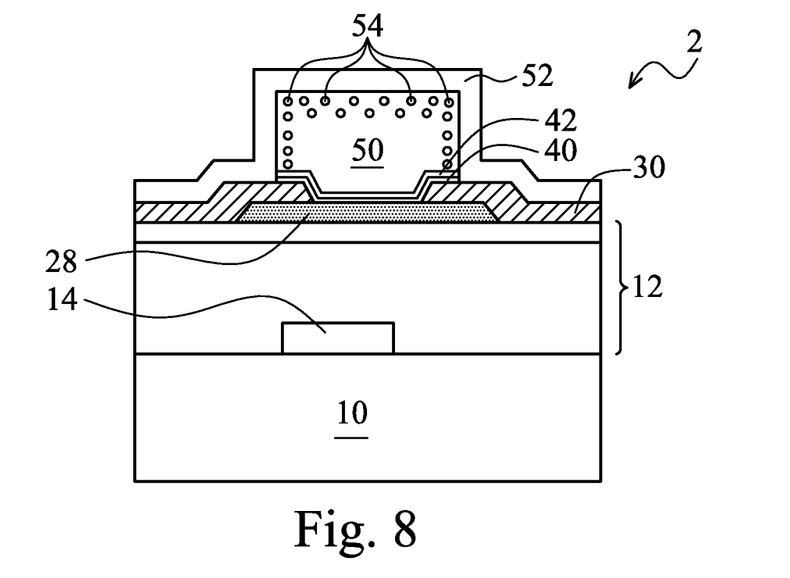

In the embodiments wherein metal bump 50 is a solder bump, flux 52 may be coated over the implanted or deposited minor elements 54, as shown in FIG. 8. In this embodiment, however, flux 52 may be substantially free from the minor elements, although it may also include the minor elements. Next, a re-flow is performed to form solder ball 56 that comprises the minor elements 54, followed by a step for removing the residue flux. The resulting structure is essentially similar to the structure as shown in FIG. 6.

In the embodiments wherein metal bump 50 cannot be re-flowed, for example, when metal bump 50 is a copper bump, no flux is coated, and no re-flow process is performed. Rather, a thermal annealing is performed to drive minor elements 54 into metal bump 50. It is observed that since metal bump 50 is not melted, the diffusibility of the minor elements in metal bump 50 is low, and hence minor elements 54 may be concentrated at a surface layer 50A of metal bump 50, which is shown in FIG. 9, while a bottom layer and/or an inner layer (region) 50B of metal bump 50 may be substantially free from minor elements 54.

After the formation of metal bump 50, and after the dicing of wafer 2, metal bump 50 and the respective die may be bonded to another integrated circuit component, such as package substrate 64 (or a printed circuit board (PCB)) as schematically illustrated in FIG. 9. At the time metal bump 50 is joined to solder bump 68 that is on integrated circuit component 64, minor elements 54 that in the surface layer may be diffused into solder bump 68, resulting in a desirable property improvement.

Figure 10:
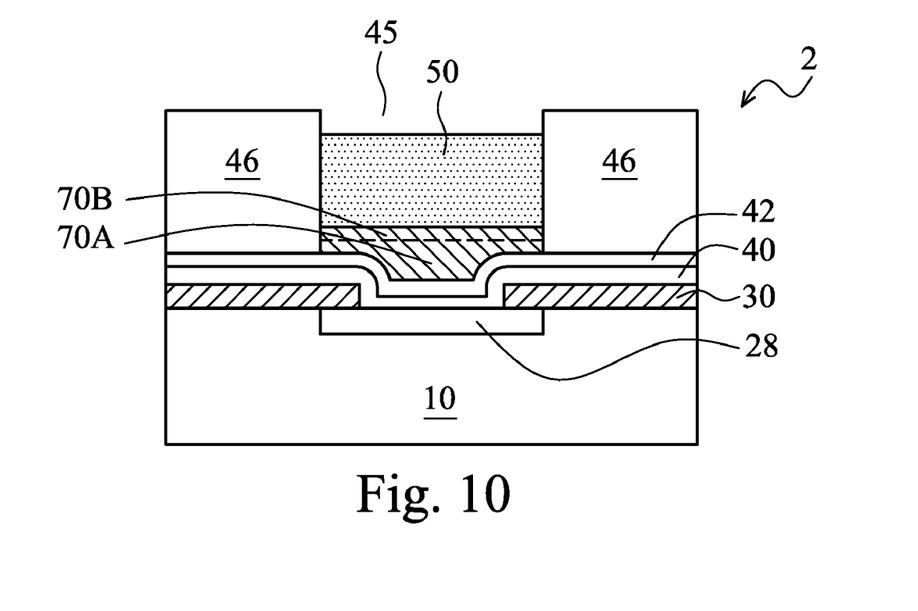
FIGS. 10 through 14 are cross-sectional views of intermediate stages in the manufacturing of a solder bump, wherein the minor elements are formed on a surface of the solder bump using electroless plating, and is melted into the solder bump.

FIGS. 10 through 14 illustrate the cross-sectional views in accordance with various alternative embodiments. Unless specified otherwise, the reference numerals in these embodiments represent like elements in other embodiments. The initial steps of these embodiments may be essentially the same as shown in FIGS. 1 and 2. Next, as shown in FIG. 10, mask 46, which may be formed of a photo resist, is formed and patterned, with a portion of UBM 40/42 being exposed through opening 45. Barrier layer 70 (including 70A and 70B) is then formed in opening 45, for example, by plating. Barrier layer 70 may comprise copper layer 70A. Further, optional nickel layer 70B may be formed on copper layer 70A. In an exemplary embodiment, copper layer 70A has a thickness between about 1 μm and about 10 μm, and may be about 5 μm. Nickel layer 70B has a thickness between about 1 μm and about 5 μm, and may be about 3 μm. Next, solder bump 50 is formed on barrier layer 70, for example, by plating.

Figure 11:
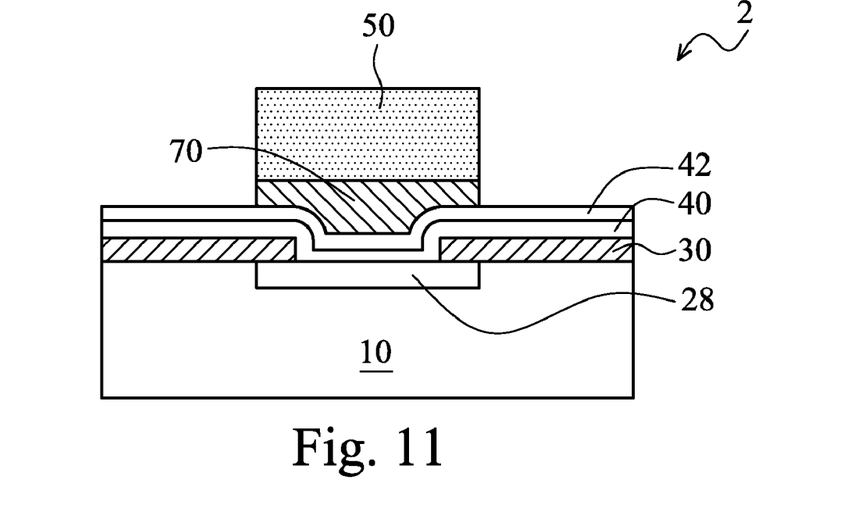
Figure 12:
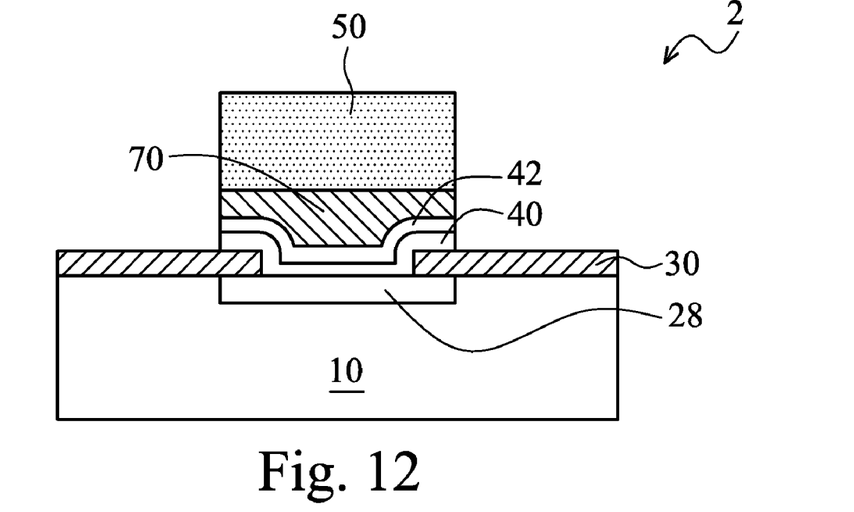
Figure 13:
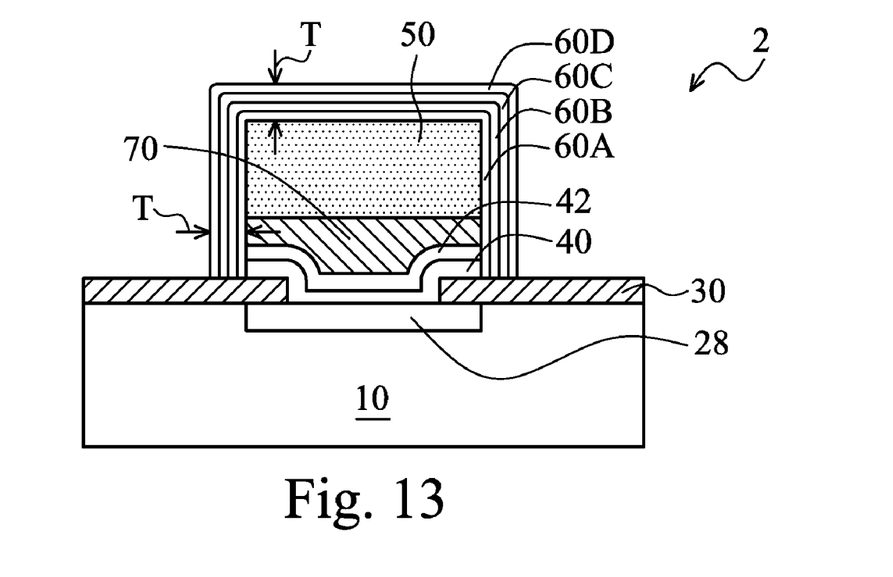

Mask 46 is then removed, as shown in FIG. 11. Next, the portions of UBM 40/42 previously covered by mask 46 are removed, resulting in the structure as shown in FIG. 12. FIG. 13 illustrates the formation of minor element containing layer 60. Minor element containing layer 60 may comprise cobalt layer 60A. Additional layers such as a nickel layer, a copper layer, and/or a gold layer, which are schematically illustrated as layers 60B, 60C, and 60D, respectively, may be formed also. It is noted that minor element containing layer 60 may include one or more of layers 60A, 60B, 60C, and 60D, and the forming sequence of these layers may be arranged in any combination. Thickness T of minor element containing layer 60 may be smaller than about 1,000 Å, smaller than about 500 Å, or even smaller than about 200 Å. The optimum thickness of minor element containing layer 60 depends on the thickness of solder bump 50, as will be discussed in detail.

Minor element containing layer 60 may be formed using electroless plating. Accordingly, minor element containing layer 60, such as cobalt layer 60A, nickel layer 60B, and copper layer 60C, is selectively (and may be sequentially), formed on solder bump 50, barrier layer 70, and UBM 40/42, but not on passivation layer 30. Gold layer 60D may be formed using immersion. By using the electroless plating, the thickness of minor element containing layer 60 may be accurately controlled.

Figure 14:
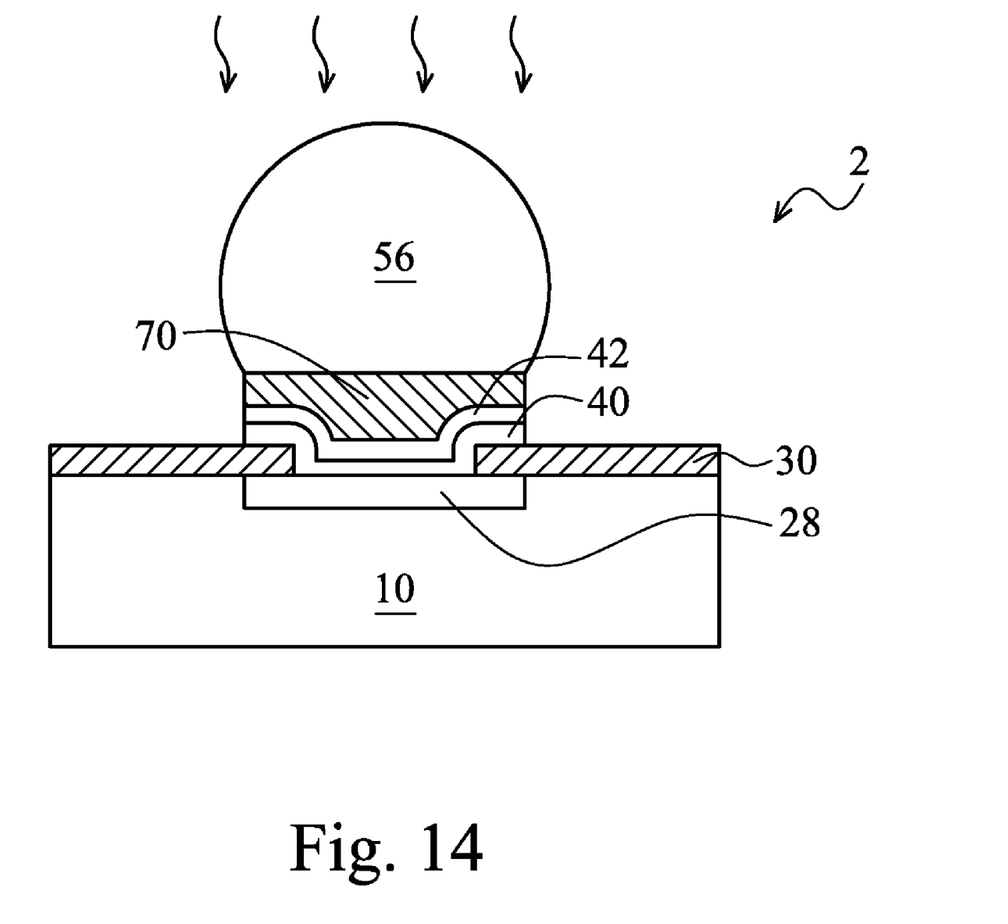

Referring to FIG. 14, a re-flow is performed to melt solder bump 50 to form solder ball 56, for example, either through the heating of wafer 2 or through a rapid thermal processing (RTP). Minor element containing layer 60 is mixed into the resulting solder ball 56. In order to make the minor elements in minor element containing layer 60 distribute more uniformly in solder ball 56, an ultrasonic (symbolized by arrows) may be applied when the re-flow is performed. After the re-flow, an additional anneal may be optionally performed at a temperature lower than the melting temperature of solder ball 56 to further diffuse the minor elements in solder ball 56.

In the resulting solder ball 56, minor elements such as cobalt may have an atomic percentage less than about 0.7 percent, or less than about 0.1 percent. Further, the atomic percentage in solder ball 56 may be lower than about 0.05 percent, or even lower than about 0.01 percent. Accordingly, assuming the thickness of solder bump in FIG. 13 is about 80 µm, then thickness T of minor element containing layer 60 may be about 480 Å if the desirable atomic percentage of the minor elements is 0.03 percent, or about 160 Å if the desirable atomic percentage is 0.01 percent. Due to the addition of cobalt and some other minor elements, the under cooling effect may be at least reduced. Accordingly, during the subsequent bonding process, solder ball(s) 56 may be solidified more uniformly.

By using the embodiments, many types of minor elements that conventionally were not suitable for being added into metal bumps can now be added. Accordingly, the properties of the metal bumps may be significantly improved. Further, the cost of adding the minor elements is low since it does not involve the using of electrolytes to incorporate the minor elements.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a device, the method comprising:
providing a substrate;
forming a solder bump over the substrate;
coating a flux over a top surface of the solder bump, wherein the flux comprises a minor element;
after the step of coating the flux, performing a re-flow process on the solder bump to drive the minor element into the solder bump; and
after the re-flow process, bonding the solder bump comprising the minor element to a package component.

2. The method of claim 1, wherein the minor element is selected from the group consisting essentially of germanium, bismuth, zinc, nickel, silver, cobalt, indium, iron, manganese, titanium, cerium, antimony, and combinations thereof.

3. The method of claim 2, wherein the minor element comprises titanium.

4. The method of claim 2, wherein the minor element comprises cobalt.

5. The method of claim 2, wherein the minor element comprises nickel.

6. The method of claim 2, wherein the minor element comprises iron.

7. The method of claim 2, wherein the minor element comprises manganese.

8. The method of claim 1 further comprising, after the step of performing the re-flow process, removing a residue of a flux on the solder bump.

9. A method of forming a device, the method comprising:
providing a substrate;
forming a metal bump over the substrate;
after the step of forming the metal bump, forming a minor element containing layer adjacent to a top surface of the metal bump, wherein the minor element containing layer comprises a minor element, wherein the minor element containing layer is substantially not formed adjacent to a bottom surface of the metal bump, and wherein the step of forming the minor element containing layer is performed using a method selected from the group consisting essentially of a chemical vapor disposition method, implantation, and plating;
performing a heating process to drive the minor element into the metal bump; and
after the step of performing the heating process, bonding the metal bump to an integrated circuit component.

10. The method of claim 9, wherein the metal bump comprises a solder bump, and wherein the heating process comprises a solder re-flow process.

11. The method of claim 10 further comprising, after the step of forming the minor element containing layer and before the step of performing the heating step, coating a flux on the minor element containing layer.

12. The method of claim 9, wherein the step of forming the minor element containing layer comprises performing an electroless plating.

13. The method of claim 9, wherein the metal bump comprises a copper bump, and wherein the step of forming the minor element containing layer comprises implanting the minor element into a top surface portion of the metal bump.

14. The method of claim 13, wherein the minor element is selected from the group consisting essentially of cobalt, germanium, bismuth, zinc, indium, iron, manganese, cerium, antimony, and combinations thereof.

15. The method of claim 9, wherein the step of forming the minor element containing layer is performed using the chemical vapor disposition method.

16. The method of claim 9, wherein the step of forming the metal bump comprises an electro plating.

17. The method of claim 9, wherein the step of forming the metal bump comprises an electroless plating.

18. The method of claim 1 further comprising, before the step of coating the flux, pre-mixing the minor element into the flux.

* * * * *